United States Patent
Moschiano et al.

(10) Patent No.: US 8,369,157 B2
(45) Date of Patent: Feb. 5, 2013

(54) METHODS FOR PROGRAMMING A MEMORY DEVICE AND MEMORY DEVICES

(75) Inventors: Violante Moschiano, Bacoli (IT); Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 13/039,778

(22) Filed: Mar. 3, 2011

(65) Prior Publication Data

US 2012/0224429 A1  Sep. 6, 2012

(51) Int. Cl.
*G11C 16/04* (2006.01)
*G11C 16/06* (2006.01)

(52) U.S. Cl. ......... 365/185.28; 365/185.02; 365/185.19; 365/185.22

(58) Field of Classification Search .............. 365/185.28
See application file for complete search history.

(56) References Cited

U.S. PATENT DOCUMENTS

| | | | |
|---|---|---|---|
| 7,499,326 B2 | 3/2009 | Hemink | |
| 7,518,909 B2 | 4/2009 | Park et al. | |
| 7,558,122 B2 * | 7/2009 | Kim et al. | 365/185.33 |
| 7,706,188 B2 | 4/2010 | Kim | |
| 7,751,246 B2 * | 7/2010 | Moschiano et al. | 365/185.22 |
| 8,051,240 B2 * | 11/2011 | Dutta et al. | 711/103 |
| 2009/0285024 A1 * | 11/2009 | Kang | 365/185.22 |
| 2010/0097863 A1 | 4/2010 | Kim et al. | |
| 2010/0124108 A1 | 5/2010 | Sarin et al. | |

* cited by examiner

*Primary Examiner* — Son Mai
(74) *Attorney, Agent, or Firm* — Leffert Jay & Polglaze, P.A.

(57) ABSTRACT

Methods for programming memory cells and memory devices are disclosed. One such method for programming includes performing a program verify operation of a group of memory cells. A number of potential CS2 situations are detected. If the number of detected potential CS2 situations is greater than a threshold, programming compensation for a CS2 situation is used in a subsequent programming operation.

31 Claims, 7 Drawing Sheets

METHODS FOR PROGRAMMING A MEMORY DEVICE AND MEMORY DEVICES

TECHNICAL FIELD

The present invention relates generally to memory and a particular embodiment relates to reduction of program disturb in non-volatile memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A flash memory is a type of memory that can be erased and reprogrammed in blocks instead of one byte at a time. A typical flash memory comprises a memory array organized in columns and rows. Changes in threshold voltage of the memory cells, through programming of charge storage structures (e.g., floating gates or charge traps) or other physical phenomena (e.g., phase change or polarization), determine the data value of each cell. The cells are usually grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation.

A NAND non-volatile memory array is typically organized such that a plurality of memory cells share a common access line (e.g., word line) and a plurality of series strings of memory cells are coupled to a common data line (e.g., bit line). Due in part to this structure, memory cells can suffer from program disturb during a programming operation. Program disturb is the change in the threshold voltages of memory cells that are not being programmed as a result of voltages being applied to common word and bit lines and/or coupling effects from adjacent memory cells being programmed.

For example, if a series string of memory cells is inhibited from being programmed, the adjacent series strings of memory cells, on either side of the inhibited series string, can affect the threshold voltages of the inhibited memory cells by floating gate-to-floating gate capacitive coupling between memory cells. This can have the effect of increasing the threshold voltages of the inhibited memory cells thus causing subsequent read errors.

One typical prior art way to reduce programming disturb is to generate a pair of programming pulses for each word line only during a fixed number of middle range programming pulses (e.g., a particular group of programming pulses of a series of programming pulses to program a memory cell). By alternating inhibition of the adjacent bit lines, one adjacent bit line of memory cells is programmed with the first of the pair of programming pulses and the other adjacent bit line of memory cells is programmed with the second of the pair of programming pulses. Thus, only one adjacent bit line of memory cells is programmed at any one time during the fixed number of pairs of programming pulses. A single programming pulse is used at other times during the series of programming pulses. However, using a fixed number of pairs of programming pulses can result in increased programming time as well as other drawbacks.

For the reasons stated above, and for other reasons stated below that will become apparent to those skilled in the art upon reading and understanding the present specification, there is a need in the art to reduce the effects of program disturb in a memory device.

DETAILED DESCRIPTION

Figure 1:
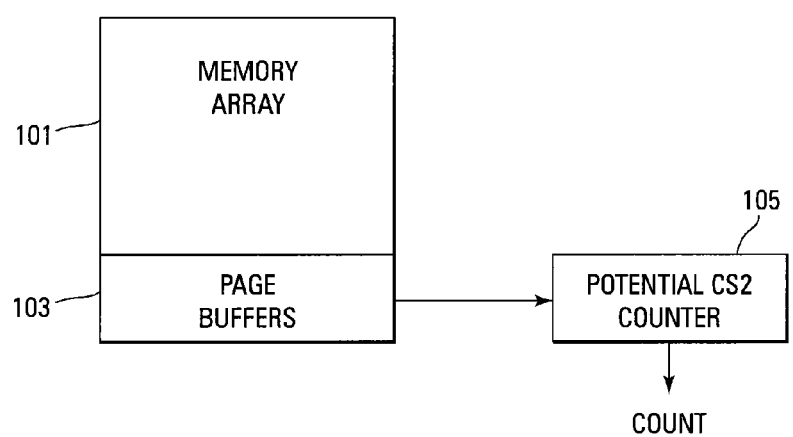
FIG. 1 shows a block diagram of one embodiment of a memory array and page buffer with adjacent bit line counter.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a block diagram of one embodiment of a memory array 101 coupled to a page buffer block 103. A potential column strip 2 (CS2) situation counter 105 (as described subsequently) is coupled to the page buffer block 103.

The page buffer block 103 comprises a plurality of page buffers. Each page buffer contains inhibit information for its respective bit line. The inhibit information can include an indication of whether a memory cell coupled to the respective bit line has passed or failed a program verify operation. If the memory cell has passed the program verify operation, the bit line should be inhibited to prevent any further programming of the memory cell. Thus, the inhibit information will indicate that the bit line has passed the program verify. A fail indication in the inhibit information indicates that the memory cell has failed the program verify operation and additional programming might be needed. One example of inhibit information is a bit that has a first state (e.g., logical 1) to indicate a pass condition and another state (e.g., logical 0) to indicate a fail condition.

As will be discussed subsequently with reference to FIGS. 3 and 7, the potential CS2 situation counter 105 counts indicators that adjacent bit lines within a selected page have failed a program verify operation (e.g., potential CS2 situations). A CS2 situation comprises an inhibited memory cell column (e.g., data or bit line) that is bordered on either side by memory cell columns (e.g., data or bit lines) that are still being programmed (e.g., have failed the program verify). When the number of potential CS2 situations is greater than a particular threshold number of potential CS2 situations, at least one subsequent programming operation is compensated in order to reduce program disturb. As used herein, the phrase "greater than a threshold" is intended to mean the same thing as "greater than or equal to a threshold" if what is being referred to as a threshold is different.

As subsequently described in greater detail, the compensation can take the form of one or more double programming pulses and/or an increased $V_{pass}$ voltage on unselected access lines (e.g., word lines) and/or an altered bit line inhibit voltage. For example, if the count is greater than the particular threshold, one or more double programming pulses at the same amplitude can be generated. The first programming pulse is applied to control gates of memory cells on half of the bit lines of the group of memory cells (e.g., page) being programmed while the second programming pulse at the same amplitude is applied to control gates of memory cells on the other half of the bit lines of the group of memory cells (e.g., page) being programmed. Thus, the memory cells on bit lines on either side of an inhibited bit line are not simultaneously being programmed.

In another embodiment, the $V_{pass}$ voltage applied to the unselected word lines during the programming operation is increased from a nominal voltage (e.g., 9V-10V) to an increased voltage (e.g., 11V). The increased $V_{pass}$ voltage should not be high enough to turn on the memory cells coupled to the increased $V_{pass}$ biased word line.

Figure 2:
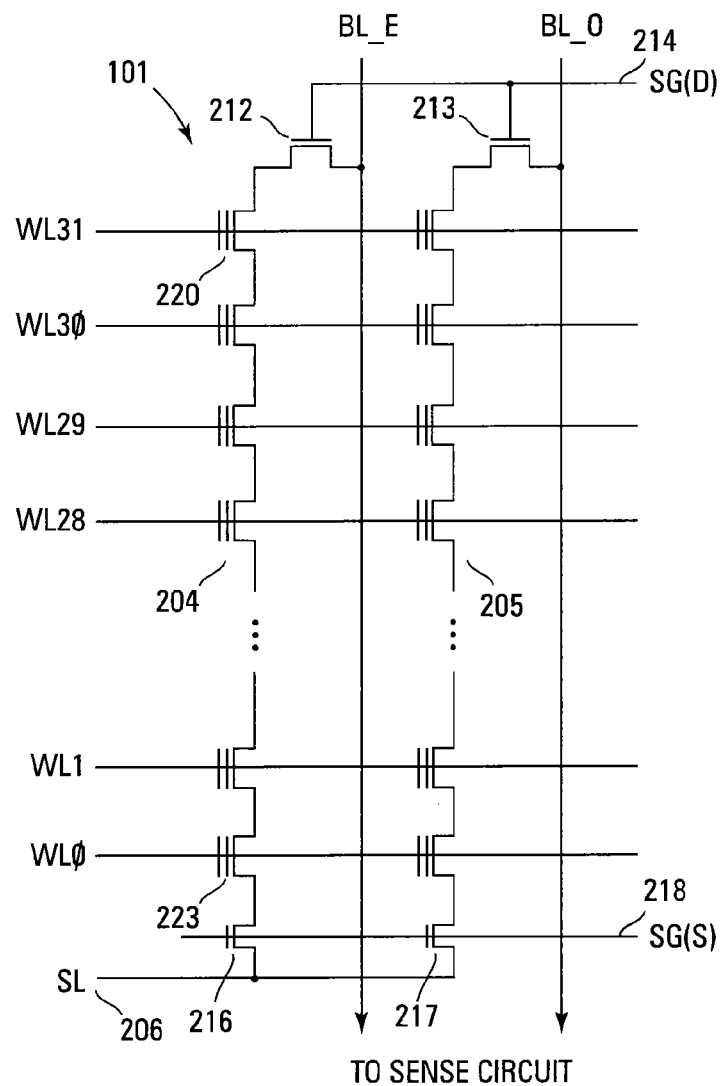
FIG. 2 shows a schematic diagram of one embodiment of a portion of a memory array in accordance with the block diagram of FIG. 1.

FIG. 2 illustrates a schematic diagram of one embodiment of a portion of the NAND architecture memory array 101, as illustrated in FIG. 1, comprising series strings of non-volatile memory cells. The present embodiments of the memory array are not limited to the illustrated NAND architecture. Alternate embodiments can use NOR or other architectures as well.

The memory array 101 comprises an array of non-volatile memory cells (e.g., floating gate) arranged in columns such as series strings 204, 205. Each of the cells is coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry that detect the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or a multiple level cell (MLC). Each cell's threshold voltage ($V_t$) is indicative of the data that is stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

Figure 7:
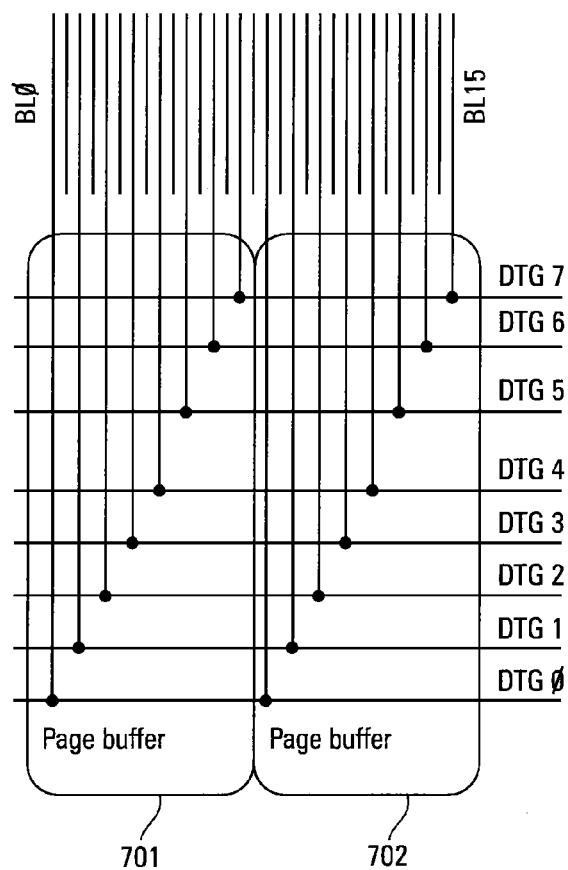
FIG. 7 shows a block diagram of one embodiment of data line and page buffer architecture.

FIG. 7 illustrates one embodiment of the bit line and page buffer architecture of FIGS. 1 and 2. The page buffers 701, 702 are shown as being coupled to the bit lines and outputting DTG0-DTG7 lines. One embodiment of the page buffer circuitry is illustrated in greater detail in FIG. 3 and described subsequently.

The illustrated embodiment assumes an even page is selected for programming. Thus, BL0 is coupled to DTG0, BL2, is coupled to DTG1, BL4 is coupled to DTG2, BL6 is coupled to DTG3, BL8 is coupled to DTG4, BL10 is coupled to DTG5, BL12 is coupled to DTG6, and BL14 is coupled to DTG7.

The subsequent description assumes that the even page is the selected page for programming. However, the present method for programming can also be executed in substantially the same manner with the odd page being the selected page for programming.

Figure 3:
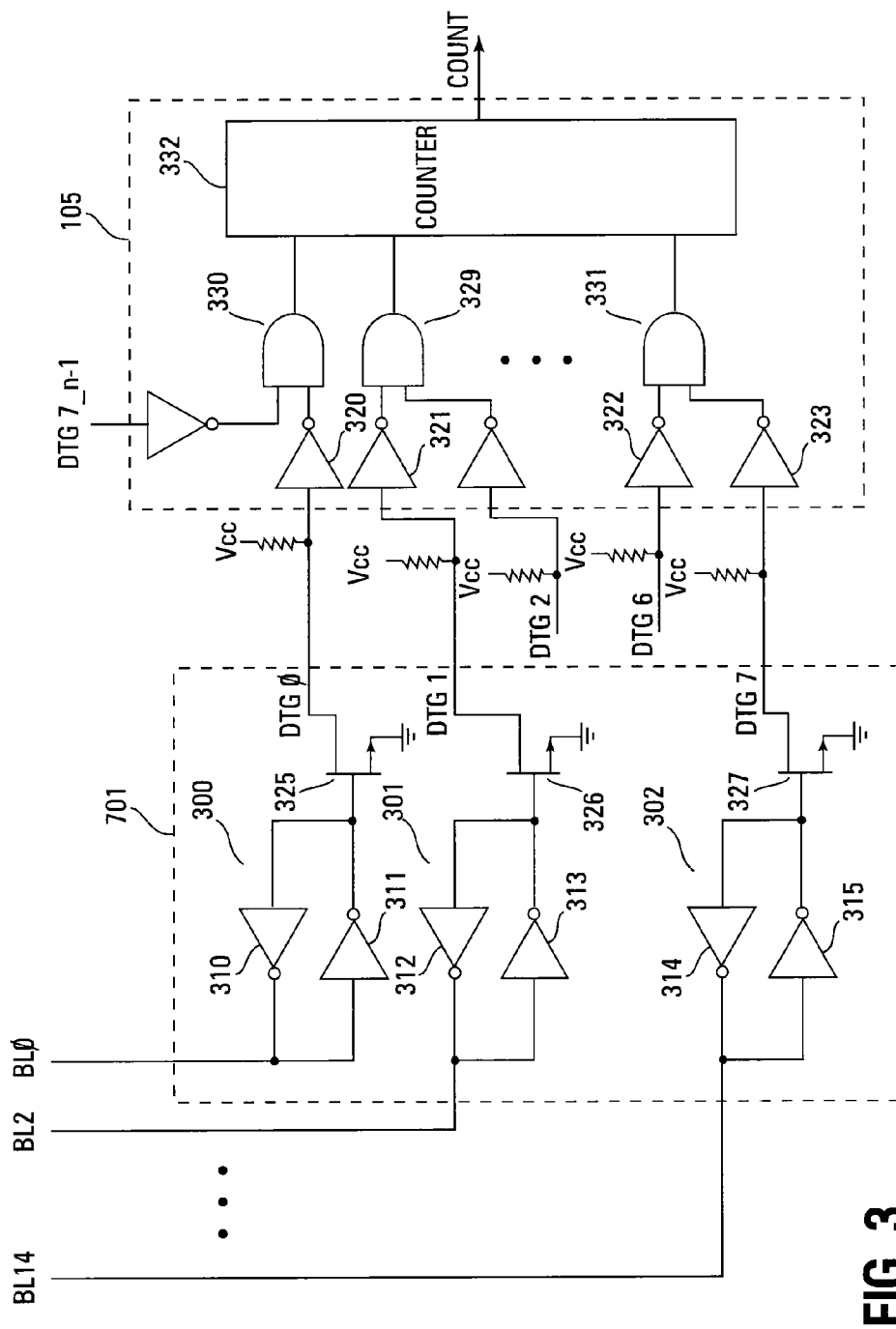
FIG. 3 shows a more detailed schematic diagram of one embodiment of the block diagram of FIG. 7.

FIG. 3 illustrates a more detailed schematic diagram of one embodiment of the block diagram of FIG. 7. For purposes of clarity, this embodiment illustrates only three bit lines BL0, BL2, and BL14 (e.g., representing 8 even bit lines) and three latches 300-302 of the page buffer 701 of FIG. 7. Alternate embodiments can implement greater than eight bit lines (e.g., multiples of eight bit lines), each coupled to a different latch.

The even bit lines BL0-BL14 from the memory array are coupled to the latches 300-302 of the page buffer 103. In one embodiment, each of these latches 300-302 can also be referred to as a primary data cache (PDC). Each of the latches comprises two inverters 310-315.

An output of each latch 300-302 is coupled to a control connection (e.g., base) of a transistor 325-327. The collector of the transistor 325-327 is coupled to an inverter 320-323 with a pulled up input. The emitters of the transistors 325-327 are coupled to a reference, such as ground. A pair of inverters 320, 321 and 322, 323 from different latches 300-302 is coupled to the inputs of a logical AND gate 329-331. The outputs of the AND gates 329-331 are input to a counter 332 that outputs a count (e.g., count of failed adjacent bit lines).

In one embodiment, one AND gate 330 has inputs (DTG7_n−1 and DTG0) from both the previous page bit line BL7_n−1 (DTG7_n−1) and the current page bit line BL0 (DTG0) since the BL7_n−1 (DTG7_n−1) bit line from the previous page is considered adjacent to the BL0 bit line of the current selected page. The next AND gate 329 has inputs from BL2 (DTG1) and BL4 (DTG2). This pattern repeats for the page to the final AND gate 331 that has BL12 (DTG6) and BL14 (DTG7) inputs.

In operation, when a memory cell coupled to a bit line fails a program verify operation, the bit line is at a first logical state (e.g., logical 0). This state is input to the bit line's respective latch 300-302. If it is assumed that memory cells coupled to their respective bit lines of BL0 and BL2 have failed their respective program verify operations, BL0 and BL2 are at a logical 0 state. Thus, the output of the inverters 311, 313 will be the inverse of their input logical state (e.g., logical 1). Alternate embodiments can use alternate logical states from those discussed.

A logical 1 applied to the base connection of the transistors 325, 326 will turn on the transistors 325, 326. Since the collectors of the transistors 325, 326 are coupled to the pulled up inputs of their respective inverters 320, 321, the turned on transistors 325, 326 will pull down the inverter inputs to approximately ground (e.g., logical 0). Thus, each inverter 320, 321 now has a logical 0 applied to its input. The inverters 320, 321 output a logical 1 state to the inputs of the logical AND gate 330 which outputs a logical 1 to the counter 332.

The counter 332 outputs a count of all of the logical AND gates that have output a logical 1. Since the inputs of each AND gate 329-331 corresponds to a respective pair of adjacent bit lines (e.g., adjacent on the same selected page), the count represents the number of adjacent bit lines on the same selected page that have indicated at least one failed program verify operation which is a potential CS2 situation. The count thus indicates the number of potential CS2 situations for a given selected page. If the number of potential CS2 situations for the given selected page is greater than a particular threshold, a CS2 situation is present.

Figure 4:
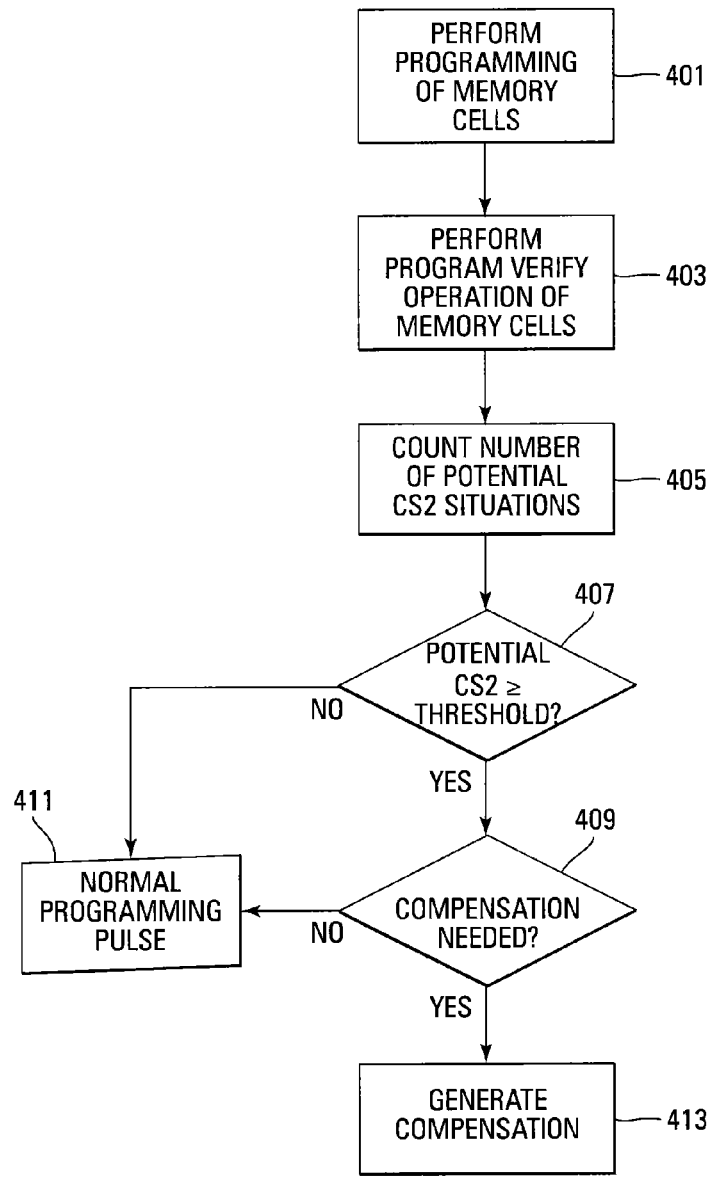
FIG. 4 shows a flowchart of one embodiment of a method for reducing program disturb.

FIG. 4 illustrates a flowchart of one embodiment of a method for reducing program disturb. A programming pulse, of a series of programming pulses, is applied to control gates of a group (e.g., page) of memory cells 401. A program verify operation is performed, after each programming pulse, on the memory cells being programmed 403. The number of potential CS2 situations is then counted 405. In one embodiment, the number of potential CS2 situations is the number of memory cells, coupled to adjacent bit lines on the selected page, that failed the program verify operation (e.g., still need to be programmed). In one embodiment, the circuitry of FIG. 3 can be used to count the number of failed adjacent bit lines on the selected page and, thus, the number of potential CS2 situations.

The number of potential CS2 situations is compared to a particular threshold of CS2 situations 407. If the number of potential CS2 situations is greater than the threshold, it has been determined that a CS2 situation exists. In this case, it is determined if program disturb compensation should be generated 409. This can be decided by determining the programming pulse number or determining the previous programming pulse voltage (e.g., pulse amplitude). Possible program disturb compensation could include double programming pulses during the following program operation, an increased pass voltage ($V_{pass}$) (relative to $V_{pass}$ of previous programming operations) on unselected access lines (e.g., word lines) during the following program operation, or changing the inhibit voltages of failed bit lines (relative to the inhibit voltages of previous programming operations) during the following program operation. The inhibit voltages are changed for a subsequent programming operation such that memory cells on failed data lines on either side of a passed data line are not programmed simultaneously.

Figure 5:
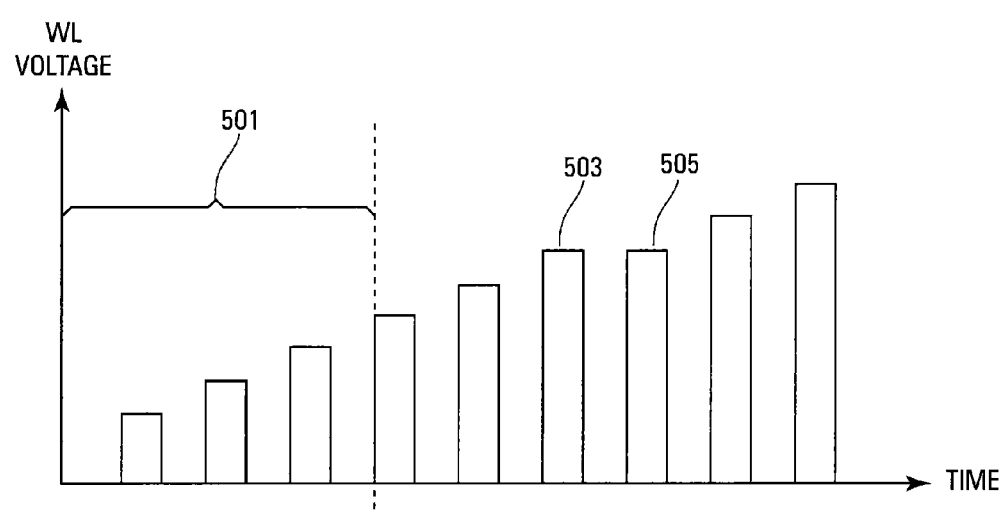
FIG. 5 shows a graph of one embodiment of probability of adjacent bit line programming versus time over a graph of word line voltages versus time that can result from the embodiment of FIG. 4.

For example, referring to the graph of FIG. 5, it can be seen that if memory cells on adjacent bit lines have failed within the first three programming pulses, no program disturb compensation is needed since the programming voltage is still relatively low and should not cause programming disturb. However, as the programming voltage increases, the likelihood of a programming disturb condition affecting the programming of memory cells also increases. Thus, after a particular programming voltage or a particular quantity of programming pulses 501 (e.g., programming pulse count threshold), double programming pulses 503, 505 having the same amplitude (or an increased $V_{pass}$ voltage) are generated during a subsequent programming operation 413. One programming pulse 503 is used to program memory cells on one of each of the pairs of failed adjacent bit lines and the second programming pulse 505 is used to program memory cells on the other of each of the pairs of failed adjacent bit lines. If there is no indication of a CS2 situation 407 or program disturb compensation is not considered necessary 409, the subsequent programming pulse can be a normal incremented programming pulse 411. Alternate embodiments can generate other forms of program disturb compensation 413.

The embodiment of FIG. 5 is for purposes of illustration only. The present embodiments are not limited to any one quantity of programming pulses or programming voltages in order to determine if double programming pulses should be generated.

Figure 6:
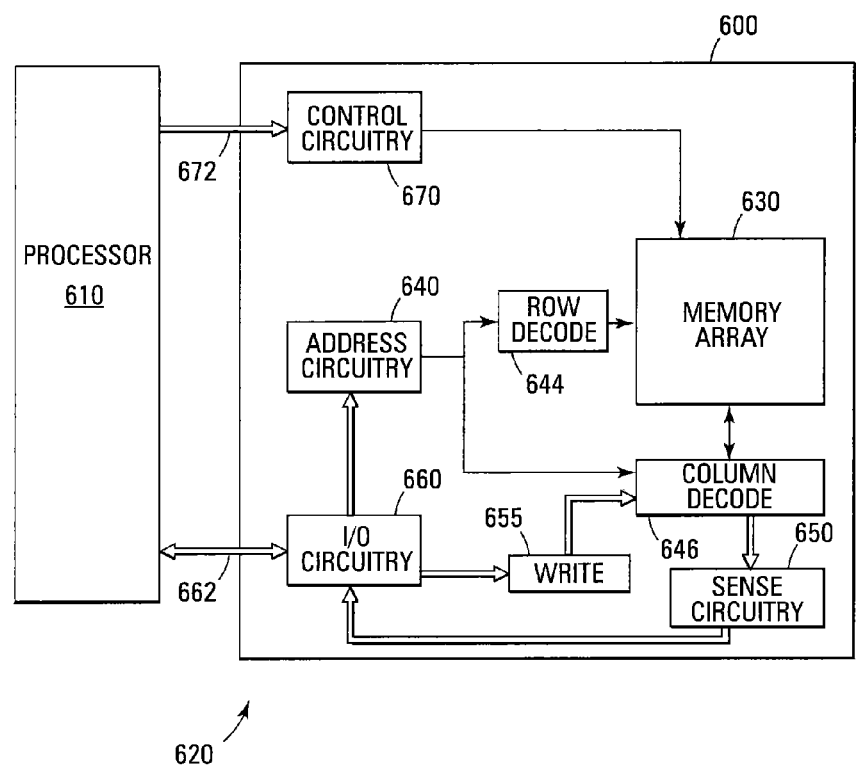
FIG. 6 shows a block diagram of one embodiment of a memory system that can incorporate the embodiments for reducing program disturb.

FIG. 6 illustrates a functional block diagram of a memory device 600 as part of a memory system 620. The memory device 600 is coupled to an external controller 610. The controller 610 may be a microprocessor or some other type of controlling circuitry. The memory device 600 has been simplified to focus on features of the memory that are helpful in understanding the present invention.

The memory device 600 includes an array 630 of non-volatile memory cells, such as the one illustrated previously in FIG. 1. The memory array 630 is arranged in banks of word line rows and bit line columns. In one embodiment, the columns of the memory array 630 are comprised of series strings of memory cells as illustrated in FIG. 1. As is well known in the art, the connections of the cells to the bit lines determines whether the array is a NAND architecture, an AND architecture, or a NOR architecture.

Address buffer circuitry 640 is provided to latch address signals provided through the I/O circuitry 660. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense circuitry. The sense circuitry 650, in one embodiment, is coupled to read and latch a row of data from the memory array 630. The sense circuitry 650 can include the page buffers as described herein. Data input and output buffer circuitry 660 is included for bidirectional data communication as well as address communication over a plurality of data connections 662 with the controller 610. Write circuitry 655 is provided to write data to the memory array.

Memory control circuitry 670 decodes signals provided on control connections 672 from the external controller 610. These signals are used to control the operations on the memory array 630, including data read, data write (program), and erase operations. The memory control circuitry 670 may be a state machine, a sequencer, or some other type of control circuitry to generate the memory control signals. In one embodiment, the memory control circuitry 670 is configured to control generation of memory control signals as a result of execution of the method for reducing program disturb.

The flash memory device illustrated in FIG. 6 has been simplified to facilitate a basic understanding of the features of the memory. A more detailed understanding of internal circuitry and functions of flash memories are known to those skilled in the art.

Conclusion

In summary, one or more embodiments of the disclosed methods for programming include determining a number of potential CS2 situations (e.g., if any memory cells of adjacent bit lines have failed a program verify). If the number of potential CS2 situations is greater than a particular threshold, program disturb compensation might be generated.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A method of programming a memory, the method comprising:
   detecting a number of potential CS2 situations; and
   compensating for a CS2 situation responsive to the number of detected potential CS2 situations being greater than a threshold.

2. The method of claim 1, wherein detecting the number of potential CS2 situations comprises detecting the number of potential CS2 situations for a particular programming step.

3. The method of claim 2, wherein compensating for the CS2 situation comprises compensating for the CS2 situation in a programming step following the particular programming step.

4. The method of claim 3, wherein compensating for the CS2 situation comprises generating a plurality of programming pulses in the programming step following the particular programming step.

5. The method of claim 4, wherein generating the plurality of programming pulses comprises generating two programming pulses in the programming step following the particular programming step, wherein each of the two programming pulses has substantially the same amplitude.

6. The method of claim 3, wherein compensating for the CS2 situation comprises increasing a pass voltage used in the programming step following the particular programming step.

7. The method of claim 1, further comprising detecting a number of pulses applied in a particular programming operation, wherein compensating for the CS2 situation is responsive to the number of detected applied pulses being greater than a pulse number threshold.

8. The method of claim 2, wherein detecting a number of potential CS2 situations comprises detecting a number of adjacent data lines in a page that have failed a program verify operation for the particular programming step.

9. The method of claim 8, wherein detecting a number of adjacent data lines in a page that have failed a program verify operation comprises detecting a number of adjacent data lines coupled to memory cells in a first page that have failed a program verify operation for the particular programming step, wherein the first page of memory cells comprises a number of memory cells having commonly coupled control gates, and wherein the number of memory cells of the first page are interleaved with a number of memory cells of a second page.

10. The method of claim 8, wherein detecting a number of adjacent data lines in a page that have failed a program verify operation comprises detecting a number of adjacent data lines coupled to memory cells in a second page that have failed a program verify operation for the particular programming step, wherein the second page of memory cells comprises a number of memory cells having commonly coupled control gates, and wherein the number of memory cells of the second page are interleaved with a number of memory cells of a first page.

11. The method of claim 9, wherein detecting a number of adjacent data lines coupled to memory cells in a first page that have failed a program verify operation comprises detecting a number of adjacent data lines coupled to memory cells in a first page that have failed a program verify operation and that border a data line coupled to a memory cell in the second page that has passed a program verify operation.

12. The method of claim 1, further comprising detecting a number of pulses applied in a particular programming operation, wherein compensating for the CS2 situation comprises compensating for the CS2 situation responsive to the number of detected potential CS2 situations being greater than a CS2 situation threshold and a number of detected applied pulses being greater than a pulse number threshold.

13. The method of claim 2, wherein detecting the number of potential CS2 situations comprises detecting a number of potential CS2 situations responsive to a voltage of a programming pulse in the particular programming step being greater than a programming voltage threshold.

14. The method of claim 2, wherein compensating for the CS2 situation comprises compensating for the CS2 situation responsive to a voltage of a programming pulse in the particular programming step being greater than a programming voltage threshold and the number of detected potential CS2 situations being greater than a potential CS2 situation threshold.

15. A method for programming memory cells, the method comprising:
   detecting a number of adjacent data lines within a selected page that have failed a program verify; and
   compensating subsequent programming of failed data lines responsive to the number of adjacent data lines that have failed the program verify being greater than a threshold.

16. The method of claim 15 wherein compensating the failed data lines is additionally responsive to a programming pulse count.

17. The method of claim 15 wherein compensating comprises applying a plurality of programming pulses to control gates of memory cells, that have failed the program verify, during a subsequent programming operation.

18. The method of claim 15 wherein compensating comprises applying an increased pass voltage, relative to a pass voltage of a previous programming operation, during a subsequent programming operation.

19. The method of claim 15 wherein compensating comprises changing an inhibit voltage for a subsequent programming operation such that memory cells on failed data lines on either side of a passed data line are not programmed simultaneously.

20. A method for programming memory cells, the method comprising:
   applying a series of incrementally increasing amplitude programming pulses to a group of memory cells;
   performing a program verify of the group of memory cells after each programming pulse; and
   compensating for a CS2 situation of the group of memory cells responsive to both a detected number of potential CS2 situations and a particular number of programming pulses applied to the group of memory cells prior to the program verify failure of memory cells.

21. The method of claim 20 wherein the group of memory cells is a selected page.

22. The method of claim 20 wherein the particular number of programming pulses is determined responsive to a particular programming voltage resulting from the particular number of programming pulses.

23. The method of claim 22 wherein the particular programming voltage is less than a programming voltage that results in program disturb of the group of memory cells.

24. The method of claim 8 and further comprising continuing the series of programming pulses without compensating when the program verify does not result in a particular number of adjacent data line failures.

25. A memory device comprising:
   an array of memory cells;
   a plurality of page buffers coupled to the array of memory cells; and
   a potential CS2 situation counter coupled to the plurality of page buffers, wherein the potential CS2 situation counter is configured to count adjacent data lines of a selected page coupled to memory cells that have failed a program verify operation.

26. The memory device of claim 25 wherein the plurality of page buffers comprise a plurality of latches, wherein each latch is coupled to a different data line of the array of memory cells and each latch is configured to latch an indication of whether its respective data line has passed the program verify operation.

27. The memory device of claim 26 wherein each latch is configured to latch a first state when memory cells coupled to its respective data line pass the program verify operation and a second, inverse state when memory cells coupled to its respective data line fail the program verify operation.

28. The memory device of claim 25 wherein each pair of page buffers for adjacent data lines of the selected page are coupled to a logical gate that generates an indication only if both page buffers indicate a failed program verify operation.

29. The memory device of claim 28 and further including a transistor coupled between each page buffer and the logical gate wherein the transistor is configured to turn on when its respective page buffer indicates a failed program verify operation.

30. The memory device of claim 29 wherein the transistor comprises a base connection coupled to it respective page buffer, a collector connection coupled to the logical gate, and an emitter connection coupled to reference potential.

31. The memory device of claim 28 wherein the adjacent data line counter comprises a counter coupled to outputs of each logical gate.

\* \* \* \* \*